(12) United States Patent
Mok et al.

(10) Patent No.: US 7,311,810 B2
(45) Date of Patent: Dec. 25, 2007

(54) TWO POSITION ANNEAL CHAMBER

(75) Inventors: Yeuk-Fai Edwin Mok, San Francisco, CA (US); Son T. Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 373 days.

(21) Appl. No.: 10/823,849

(22) Filed: Apr. 13, 2004

(65) Prior Publication Data

US 2004/0209414 A1    Oct. 21, 2004

Related U.S. Application Data

(60) Provisional application No. 60/463,860, filed on Apr. 18, 2003.

(51) Int. Cl.
*C25D 17/00* (2006.01)

(52) U.S. Cl. .................................. 204/242; 204/269

(58) Field of Classification Search .............. 204/232, 204/240, 282, 269, 287, 242, 267
See application file for complete search history.

(56) References Cited

U.S. PATENT DOCUMENTS

| | | | |
|---|---|---|---|
| 3,649,509 A | 3/1972 | Morawetz et al. |
| 3,727,620 A | 4/1973 | Orr |
| 3,770,598 A | 11/1973 | Creutz |
| 4,027,686 A | 6/1977 | Shortes et al. |
| 4,092,176 A | 5/1978 | Kozai et al. |
| 4,110,176 A | 8/1978 | Creutz et al. |
| 4,113,492 A | 9/1978 | Sato et al. |
| 4,315,059 A | 2/1982 | Raistrick et al. |
| 4,326,940 A | 4/1982 | Eckles et al. |
| 4,336,114 A | 6/1982 | Mayer et al. |
| 4,376,685 A | 3/1983 | Watson |
| 4,405,416 A | 9/1983 | Raistrick et al. |
| 4,428,815 A | 1/1984 | Powell et al. |
| 4,435,266 A | 3/1984 | Johnston |
| 4,489,740 A | 12/1984 | Rattan et al. |
| 4,510,176 A | 4/1985 | Cuthbert et al. |

(Continued)

FOREIGN PATENT DOCUMENTS

EP        0 421 735 A2    4/1991

(Continued)

OTHER PUBLICATIONS

Colombo, "Wafer Back Surface Film Removal"0, Central R&D, SGS-Thomson Microelectronics, Agrate, Italy, Spin Tech Technology, 6 pages, unknown date.

(Continued)

*Primary Examiner*—David Vu
(74) *Attorney, Agent, or Firm*—Patterson & Sheridan, LLP (57) ABSTRACT

Embodiments of the invention generally provide an annealing apparatus and method for a semiconductor processing platform. The annealing apparatus includes a plurality of isolated annealing chambers, wherein each of the annealing chambers has a heating plate positioned in a sealed processing volume, a cooling plate positioned in the processing volume, and a substrate transfer mechanism positioned in the processing volume and configured to transfer substrates between the heating plate and the cooling plate. The annealing system further includes a gas supply source selectively in communication with each of the individual annealing chambers.

25 Claims, 7 Drawing Sheets

U.S. PATENT DOCUMENTS

| | | |
|---|---|---|
| 4,518,678 A | 5/1985 | Allen |
| 4,519,846 A | 5/1985 | Aigo |
| 4,568,431 A | 2/1986 | Polan |
| 4,693,805 A | 9/1987 | Quazi |
| 4,732,785 A | 3/1988 | Brewer |
| 4,789,445 A | 12/1988 | Goffman et al. |
| 4,816,098 A | 3/1989 | Davis et al. |
| 5,039,381 A | 8/1991 | Mullarkey |
| 5,055,425 A | 10/1991 | Leibovitz et al. |
| 5,069,760 A | 12/1991 | Tsukamoto et al. |
| 5,092,975 A | 3/1992 | Yamamura et al. |
| 5,100,516 A | 3/1992 | Nishimura et al. |
| 5,155,336 A | 10/1992 | Gronet et al. |
| 5,162,260 A | 11/1992 | Leibovitz et al. |
| 5,222,310 A | 6/1993 | Thompson et al. |
| 5,224,504 A | 7/1993 | Thompson et al. |
| 5,230,743 A | 7/1993 | Thompson et al. |
| 5,252,807 A | 10/1993 | Chizinsky |
| 5,256,274 A | 10/1993 | Poris |
| 5,259,407 A | 11/1993 | Tuchida et al. |
| 5,290,361 A | 3/1994 | Hayashida et al. |
| 5,292,393 A | 3/1994 | Maydan et al. |
| 5,316,974 A | 5/1994 | Crank |
| 5,324,684 A | 6/1994 | Kermani et al. |
| 5,328,589 A | 7/1994 | Martin |
| 5,349,978 A | 9/1994 | Sago et al. |
| 5,368,711 A | 11/1994 | Poris |
| 5,377,425 A | 1/1995 | Kawakami et al. |
| 5,377,708 A | 1/1995 | Bergman et al. |
| 5,415,890 A | 5/1995 | Kloiber et al. |
| 5,429,733 A | 7/1995 | Ishida |
| 5,431,700 A | 7/1995 | Sloan |
| 5,442,235 A | 8/1995 | Parrillo et al. |
| 5,447,615 A | 9/1995 | Ishida |
| 5,449,447 A | 9/1995 | Branders |
| 5,516,412 A | 5/1996 | Andricacos et al. |
| 5,527,739 A | 6/1996 | Parrillo et al. |
| 5,608,943 A | 3/1997 | Konishi et al. |
| 5,625,170 A | 4/1997 | Poris |
| 5,651,865 A | 7/1997 | Sellers |
| 5,677,244 A | 10/1997 | Venkatraman |
| 5,705,223 A | 1/1998 | Bunkofske |
| 5,716,207 A | 2/1998 | Mishina et al. |
| 5,718,813 A | 2/1998 | Drummond et al. |
| 5,723,028 A | 3/1998 | Poris |
| 5,820,692 A | 10/1998 | Baecker et al. |
| 5,884,009 A | 3/1999 | Okase |
| 5,994,675 A | 11/1999 | Bethune et al. |
| 6,015,749 A | 1/2000 | Liu et al. |
| 6,071,388 A | 6/2000 | Uzoh |
| 6,072,163 A | 6/2000 | Armstrong et al. |
| 6,093,291 A | 7/2000 | Izumi et al. |
| 6,136,163 A | 10/2000 | Cheung et al. |
| 6,187,152 B1 | 2/2001 | Ting et al. |
| 6,203,582 B1 | 3/2001 | Berner et al. |
| 6,207,005 B1 | 3/2001 | Henley et al. |
| 6,207,937 B1 | 3/2001 | Stoddard et al. |
| 6,211,945 B1 | 4/2001 | Baxter et al. |
| 6,222,164 B1 | 4/2001 | Stoddard et al. |
| 6,242,349 B1 | 6/2001 | Nogami et al. |
| 6,258,220 B1 | 7/2001 | Dordi et al. |
| 6,267,853 B1 | 7/2001 | Dordi et al. |
| 6,276,072 B1 | 8/2001 | Morad et al. |
| 6,290,833 B1 | 9/2001 | Chen |
| 6,290,865 B1 | 9/2001 | Lloyd et al. |
| 6,290,933 B1 | 9/2001 | Durga et al. |
| 6,294,059 B1 | 9/2001 | Hongo et al. |
| 6,296,906 B1 | 10/2001 | Stimmell et al. |
| 6,307,184 B1 | 10/2001 | Womack et al. |
| 6,309,520 B1 | 10/2001 | Woodruff et al. |
| 6,368,966 B1 | 4/2002 | Krishnamoorthy et al. |
| 6,423,947 B2 | 7/2002 | Womack et al. |
| 6,428,673 B1 | 8/2002 | Ritzdorf et al. |
| 6,440,178 B2 | 8/2002 | Berner et al. |
| 6,483,081 B1 | 11/2002 | Batchelder |
| 6,508,920 B1 | 1/2003 | Ritzdorf et al. |
| 6,529,686 B2 | 3/2003 | Ramanan et al. |
| 6,544,338 B1 | 4/2003 | Batchelder et al. |
| 6,639,189 B2 | 10/2003 | Ramanan et al. |
| 6,740,196 B2 | 5/2004 | Lee et al. |
| 2001/0030101 A1 | 10/2001 | Berner et al. |
| 2002/0000271 A1 | 1/2002 | Ritzdorf et al. |
| 2002/0022363 A1 | 2/2002 | Ritzdorf et al. |
| 2002/0029961 A1 | 3/2002 | Dordi et al. |
| 2002/0037641 A1 | 3/2002 | Ritzdorf et al. |
| 2002/0074233 A1 | 6/2002 | Ritzdorf et al. |
| 2003/0045095 A1 | 3/2003 | Ritzdorf et al. |
| 2004/0016637 A1 * | 1/2004 | Yang et al. ................. 204/242 |

FOREIGN PATENT DOCUMENTS

| | | |
|---|---|---|
| EP | 0 881 673 A2 | 12/1998 |
| EP | 1 037 263 A2 | 9/2000 |
| EP | 1 085 557 A2 | 3/2001 |
| JP | 54-148112 | 11/1979 |
| JP | 58-182823 | 10/1983 |
| JP | 63-118093 | 5/1988 |
| JP | 4-131395 | 5/1992 |
| JP | 4-280993 | 10/1992 |
| JP | 6-17291 | 1/1994 |
| WO | WO 93/17448 | 9/1993 |
| WO | WO 97/12079 | 4/1997 |
| WO | WO 99/40615 | 8/1999 |

OTHER PUBLICATIONS

Holm, Electric Contacts Theory and Application, Fourth Completely Rewritten Edition, Springer-Verlag, New York Inc., Aug. 21, 1967, 27 pages.

Jiang, et al., "Variations in Cu CMP Removal Rate Due to Cu Film Self-Annealing", Advanced Metallization Conference in 1998 (AMC 1998), 8 pages.

Pitney, "NEY Contact Manual", Electric Contacts for Low Energy Uses, 1973.

Simpson, et al., "The Electrical Integrity of Copper Plated Wafers Using a Novel Plating Bath Chemistry" Slides Publicly Disclosed, 13 Pages Oct. 17-22, 1999.

Singer, "Tantalum, Copper and Damascene: The Future of Interconnects," Semiconductor International, Jun. 1998, Pages cover, pp. 91-94, 96, & 98.

Singer, "Wafer Processing", Semiconductor International, Jun. 1998, p. 70.

Laurel Technologies Corporation from www.laurell.com, "Two control configurations available- seeWS 400 OR WS-400Lite." 1998, 6 pages.

Welcome to Verteq Online Products Overview, from Verteq from www.verteq.com, unknown date.

"Metallization & Interconnect", Semitool, Inc., 1998, 4 pages.

European Search Report from EP 0 110 3525 dated Jul. 10. 2001.

European Search Report for Application 301415.6 dated Dec. 11, 2000.

Austrian Patent Office Search report for Application 00010504, unknown date.

* cited by examiner

TWO POSITION ANNEAL CHAMBER

CROSS-REFERENCE TO RELATED APPLICATIONS

This application claims benefit of U.S. provisional patent application Ser. No. 60/463,860, filed Apr. 18, 2003, which is herein incorporated by reference.

BACKGROUND OF THE INVENTION

1. Field of the Invention

Embodiments of the invention generally relate to a system for annealing semiconductor substrates.

2. Description of the Related Art

Metallization of sub-quarter micron sized features is a foundational technology for present and future generations of integrated circuit manufacturing processes. More particularly, in devices such as ultra large scale integration-type devices, i.e., devices having integrated circuits with more than a million logic gates, the multilevel interconnects that lie at the heart of these devices are generally formed by filling high aspect ratio, i.e., greater than about 4:1, interconnect features with a conductive material, such as copper. Conventionally, deposition techniques such as chemical vapor deposition (CVD) and physical vapor deposition (PVD) have been used to fill these interconnect features. However, as the interconnect sizes decrease and aspect ratios increase, void-free interconnect feature fill via conventional metallization techniques becomes increasingly difficult. Therefore, plating techniques, i.e., electrochemical plating (ECP) and electroless plating, have emerged as promising processes for void free filling of sub-quarter micron sized high aspect ratio interconnect features in integrated circuit manufacturing processes.

In an ECP process, for example, sub-quarter micron sized high aspect ratio features formed into the surface of a substrate (or a layer deposited thereon) may be efficiently filled with a conductive material. ECP plating processes are generally two stage processes, wherein a seed layer is first formed over the surface features of the substrate (generally through PVD, CVD, or other deposition process in a separate tool), and then the surface features of the substrate are exposed to an electrolyte solution (in the ECP tool), while an electrical bias is applied between the seed layer and a copper anode positioned within the electrolyte solution. The electrolyte solution generally contains ions to be plated onto the surface of the substrate, and therefore, the application of the electrical bias causes these ions to be plated onto the biased seed layer, thus depositing a layer of the ions on the substrate surface that may fill the features.

Once the plating process is completed, the substrate is generally transferred to at least one of a substrate rinsing cell or a bevel edge clean cell. Bevel edge clean cells are generally configured to dispense an etchant onto the perimeter or bevel of the substrate to remove unwanted metal plated thereon. The substrate rinse cells, often called spin rinse dry cells, generally operate to rinse the surface of the substrate (both front and back) with a rinsing solution to remove any contaminants therefrom. Further the rinse cells are often configured to spin the substrate at a high rate of speed in order to spin off any remaining fluid droplets adhering to the substrate surface. Once the remaining fluid droplets are spun off, the substrate is generally clean and dry, and therefore, ready for transfer from the ECP tool.

Thereafter, the cleaned/rinsed substrate is often transferred to an annealing chamber where the substrate is heated to a temperature sufficient to anneal the deposited film. However, the throughput of conventional plating systems may be limited by the availability of the annealing chamber, as an annealing process for a semiconductor substrate after plating may take several minutes. Further, once the annealing process is completed, the annealed substrate generally takes several minutes to cool down to a temperature that allows for transfer of the substrate to another processing chamber or device.

Embodiments of the invention generally provide an annealing system configured for use on a semiconductor processing system, wherein the annealing system is capable of simultaneously processing several substrates in order to increase the annealing throughput. Additionally, embodiments of the invention generally provide an annealing system that is capable of heating a substrate for an annealing process, and then rapidly cooling the substrate in the annealing chamber after the annealing/heating process is complete.

SUMMARY OF THE INVENTION

Embodiments of the invention generally provide a novel annealing system for a semiconductor processing platform. The annealing system may be positioned in communication with the semiconductor processing platform at various locations, such as in communication with the mainframe of the processing platform, a loading station of the processing platform, or a link tunnel connecting the loading station to the processing platform. The annealing system includes a stacked annealing chamber configuration that uses minimal vertical space, as the individual stacked annealing chambers are vertically compact, and therefore, access to the individual annealing chambers is simplified as minimal vertical or Z-direction robot movements are required to access the individual anneal chambers. Further, the implementation of the plurality of stacked annealing chambers increases substrate throughput without increasing the footprint, as multiple substrates may be simultaneously annealed in the individual stacked annealing chambers. Additionally, the stacked annealing chambers may be individually in communication with vacuum sources and process gas sources, which allows for individual processing in the respective annealing chambers at particular pressures. More particularly, the processing pressure in one annealing chamber may be controlled to be different from another chamber, and further, the isolation of the respective annealing chambers from each other allows for a substrate to be annealed in one chamber at a particular pressure, while another substrate is loaded into a separate anneal chamber in the stack of chambers at a second pressure that is different from the first. Further, the isolation of the respective annealing chambers allows for one annealing chamber in the stack to go offline, such as when a malfunction occurs or when a substrate breaks in the annealing chamber, without interfering or contaminating the remaining annealing chambers.

Embodiments of the invention generally provide an annealing system for a semiconductor processing platform. The annealing system includes a plurality of isolated annealing chambers, wherein each of the annealing chambers has a heating plate positioned in a sealed processing volume, a cooling plate positioned in the processing volume, and a substrate transfer mechanism positioned in the processing volume and configured to transfer substrates between the heating plate and the cooling plate. The annealing system further includes a gas supply source selectively in communication with each of the individual annealing chambers.

Embodiments of the invention may further provide an annealing station, wherein the annealing station includes a plurality of individual annealing chambers. Each annealing chamber generally defines an interior processing volume that has a heating plate and a cooling plate positioned therein. A substrate transfer robot is positioned to receive a substrate from an externally positioned robot and transfer the substrate between the heating plate and the cooling plate, and a processing gas supply is selectively in communication with each of the annealing chambers.

Embodiments of the invention may further provide a semiconductor processing platform. The platform includes a substrate loading station, at least one substrate plating cell positioned on a mainframe that is in communication with the loading station, at least one substrate cleaning cell positioned on the mainframe, and an annealing station positioned in communication with the mainframe. The annealing station includes a plurality of stacked annealing chambers, each of the annealing chambers defining a sealed processing volume, a heating plate positioned in the sealed processing volume of each of the annealing chamber, a cooling plate positioned in the sealed processing volume of each of the annealing chamber, and a substrate transfer mechanism positioned to transfer substrates between the heating plate and the cooling plate. The platform further includes a gas supply source selectively in communication with each of the sealed processing volumes, and at least one substrate transfer robot positioned transfer substrates between the loading station, plating cell, cleaning cell, and the annealing station.

Embodiments of the invention may further provide a method for annealing a substrate. The method includes positioning the substrate in an annealing chamber, sealing the annealing chamber and removing a portion of ambient gases therefrom, supplying a processing gas to the annealing chamber, transferring the substrate to a heating plate for a first predetermined period of time, the heating plate being maintained at a temperature of between about 200° C. and 400° C., and transferring the substrate from the heating plate to a cooling plate for a second predetermined period of time, the cooling plate being configured to cool the substrate to a temperature of between about 50° C. and 100° C. in less than about 30 seconds.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a multi-chemistry electrochemical plating system configured to plate conductive materials onto semiconductor substrates. The plating system generally includes a substrate loading area in communication with a substrate processing platform. The loading area is generally configured to receive substrate containing cassettes and transfer substrates received from the cassettes to the processing platform for processing. The loading area generally includes a robot configured to transfer substrates to and from the cassettes and to the processing platform or a substrate annealing chamber positioned in communication with the loading area, processing platform, or a link tunnel positioned between the loading station and the processing platform. The processing platform generally includes at least one substrate transfer robot and a plurality of substrate processing cells, i.e., ECP cells, bevel clean cells, spin rinse dry cells, substrate cleaning cells, and/or electroless plating cells.

Figure 1:
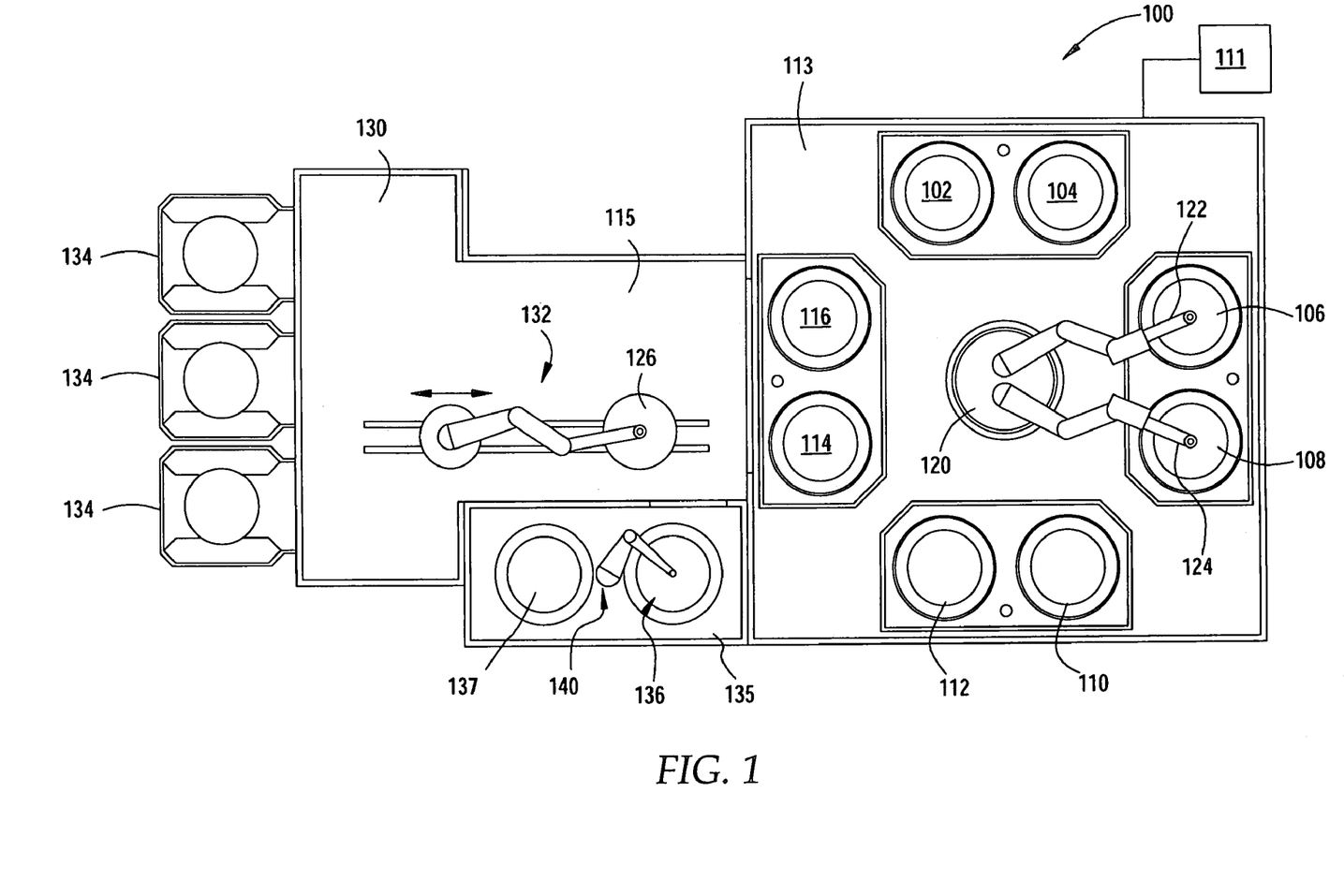
FIG. 1 is a top plan view of one embodiment of an electrochemical plating system of the invention.

FIG. 1 illustrates a top plan view of an ECP system 100 of the invention. ECP system 100 includes a factory interface (FI) 130, which is also generally termed a substrate loading station. Factory interface 130 includes a plurality of substrate loading stations configured to interface with substrate containing cassettes 134. A robot 132 is positioned in factory interface 130 and is configured to access substrates contained in the cassettes 134. Further, robot 132 also extends into a link tunnel 115 that connects factory interface 130 to processing mainframe or platform 113. The position of robot 132 allows the robot to access substrate cassettes 134 to retrieve substrates therefrom and then deliver the substrates to one of the processing cells 114, 116 positioned on the mainframe 113, or alternatively, to the annealing station 135. Similarly, robot 132 may be used to retrieve substrates from the processing cells 114,116 or the annealing chamber 135 after a substrate processing sequence is complete. In this situation robot 132 may deliver the substrate back to one of the cassettes 134 for removal from system 100.

The anneal station 135, which will be further discussed herein, generally includes a two position annealing chamber, wherein a cooling plate/position 136 and a heating plate/position 137 are positioned adjacently with a substrate transfer robot 140 positioned proximate thereto, e.g., between the two stations. The robot 140 is generally configured to move substrates between the respective heating 137 and cooling plates 136. Further, although the anneal chamber 135 is illustrated as being positioned such that it is accessed from the link tunnel 115, embodiments of the invention are not limited to any particular configuration or placement. As such, the anneal station 135 may be positioned in direct communication with the mainframe 113, i.e., accessed by mainframe robot 120, or alternatively, the annealing station 135 may be position in communication with the mainframe 113, i.e., the annealing station may be positioned on the same system as mainframe 113, but may not be in direct contact with the mainframe 113 or accessible from the mainframe robot 120. For example, as illustrated in FIG. 1, the anneal station 135 may be positioned in direct communication with the link tunnel 115, which allows for access to mainframe 113, and as such, the anneal chamber 135 is illustrated as being in communication with the mainframe 113.

As mentioned above, ECP system 100 also includes a processing mainframe 113 having a substrate transfer robot 120 centrally positioned thereon. Robot 120 generally includes one or more arms/blades 122, 124 configured to support and transfer substrates thereon. Additionally, the robot 120 and the accompanying blades 122, 124 are generally configured to extend, rotate, and vertically move so that the robot 120 may insert and remove substrates to and from a plurality of processing locations 102, 104, 106, 108, 110, 112, 114, 116 positioned on the mainframe 113. Similarly, factory interface robot 132 also includes the ability to rotate, extend, and vertically move its substrate support blade, while also allowing for linear travel along the robot track that extends from the factory interface 130 to the mainframe 113. Generally, process locations 102, 104, 106, 108, 110,112, 114, 116 may be any number of processing cells utilized in an electrochemical plating platform. More particularly, the process locations may be configured as electrochemical plating cells, rinsing cells, bevel clean cells, spin rinse dry cells, substrate surface cleaning cells (which collectively includes cleaning, rinsing, and etching cells), electroless plating cells, metrology inspection stations, and/ or other processing cells that may be beneficially used in conjunction with a plating platform. Each of the respective processing cells and robots are generally in communication with a process controller 111, which may be a microprocessor-based control system configured to receive inputs from both a user and/or various sensors positioned on the system 100 and appropriately control the operation of system 100 in accordance with the inputs.

In the exemplary plating system illustrated in FIG. 1, the processing locations may be configured as follows. Processing locations 114 and 116 may be configured as an interface between the wet processing stations on the mainframe 113 and the dry processing regions in the link tunnel 115, annealing chamber 135, and the factory interface 130. The processing cells located at the interface locations may be spin rinse dry cells and/or substrate cleaning cells. More particularly, each of locations 114 and 116 may include both a spin rinse dry cell and a substrate cleaning cell in a stacked configuration. Locations 102, 104, 110, and 112 may be configured as plating cells, either electrochemical plating cells or electroless plating cells, for example. Locations 106, 108 may be configured as substrate bevel cleaning cells. Additional configurations and implementations of an electrochemical processing system are illustrated in commonly assigned U.S. patent application Ser. No. 10/435,121 filed on Dec. 19, 2002 entitled "Multi-Chemistry Electrochemical Processing System", which is incorporated herein by reference in its entirety.

Figure 2:
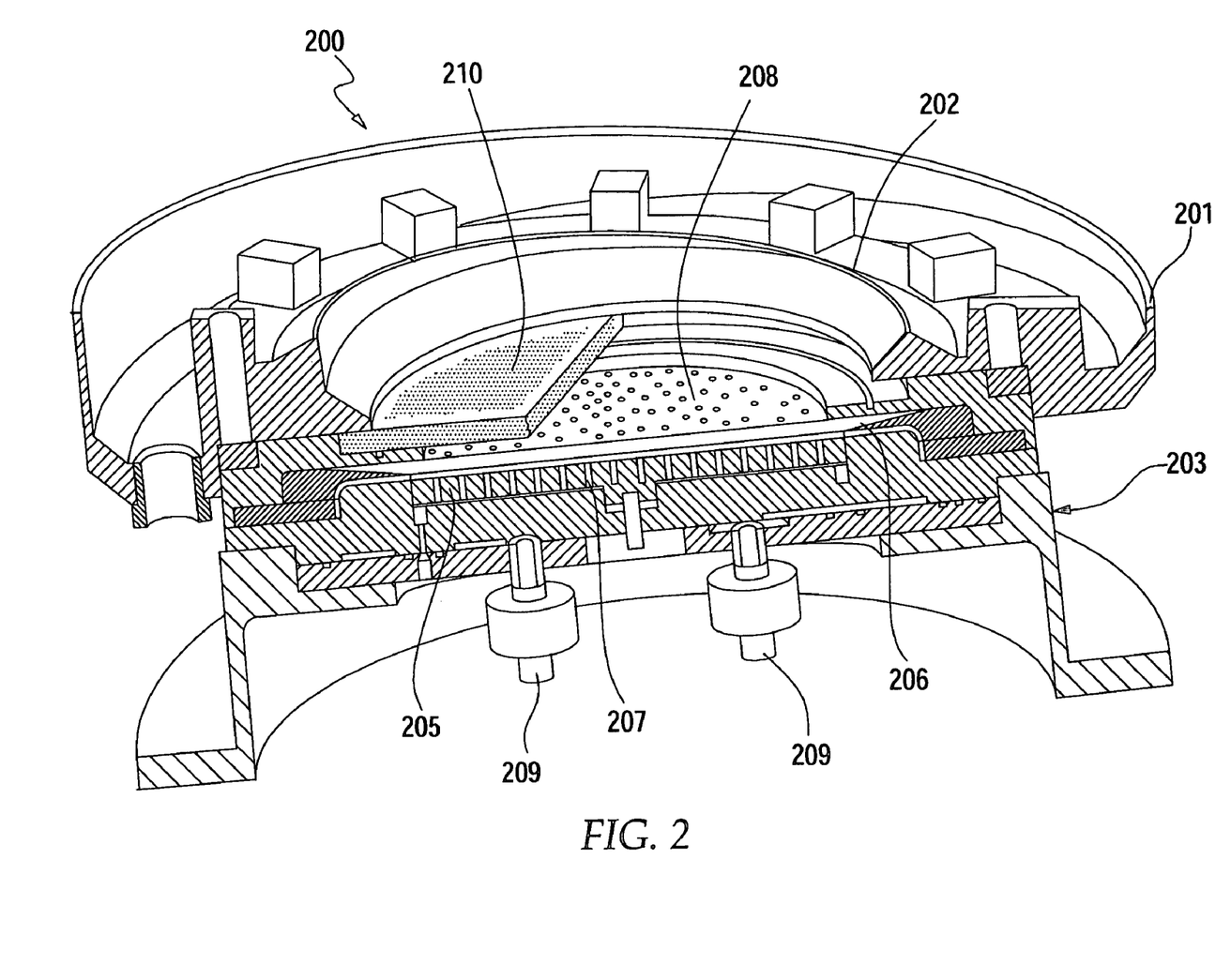
FIG. 2 illustrates an exemplary embodiment of a plating cell used in the electrochemical plating cell of the invention.

FIG. 2 illustrates a partial perspective and sectional view of an exemplary plating cell 200 that may be implemented in processing locations 102, 104, 110, and 112. The electrochemical plating cell 200 generally includes an outer basin 201 and an inner basin 202 positioned within outer basin 201. Inner basin 202 is generally configured to contain a plating solution that is used to plate a metal, e.g., copper, onto a substrate during an electrochemical plating process. During the plating process, the plating solution is generally continuously supplied to inner basin 202 (at about 1 gallon per minute for a 10 liter plating cell, for example), and therefore, the plating solution continually overflows the uppermost point (generally termed a "weir") of inner basin 202 and is collected by outer basin 201 and drained therefrom for chemical management and recirculation. Plating cell 200 is generally positioned at a tilt angle, i.e., the frame portion 203 of plating cell 200 is generally elevated on one side such that the components of plating cell 200 are tilted between about 3° and about 30°, or generally between about 4° and about 10° for optimal results. The frame member 203 of plating cell 200 supports an annular base member on an upper portion thereof. Since frame member 203 is elevated on one side, the upper surface of base member 204 is generally tilted from the horizontal at an angle that corresponds to the angle of frame member 203 relative to a horizontal position. Base member 204 includes an annular or disk shaped recess formed into a central portion thereof, the annular recess being configured to receive a disk shaped anode member 205. Base member 204 further includes a plurality of fluid inlets/drains 209 extending from a lower surface thereof. Each of the fluid inlets/drains 209 are generally configured to individually supply or drain a fluid to or from either the anode compartment or the cathode compartment of plating cell 200. Anode member 205 generally includes a plurality of slots 207 formed therethrough, wherein the slots 207 are generally positioned in parallel orientation with each other across the surface of the anode 205. The parallel orientation allows for dense fluids generated at the anode surface to flow downwardly across the anode surface and into one of the slots 207. Plating cell 200 further includes a membrane support assembly 206. Membrane support assembly 206 is generally secured at an outer periphery thereof to base member 204, and includes an interior region configured to allow fluids to pass therethrough. A membrane 208 is stretched across the support 206 and operates to fluidly separate a catholyte chamber and anolyte chamber portions of the plating cell. The membrane support assembly may include an o-ring type seal positioned near a perimeter of the membrane, wherein the seal is configured to prevent fluids from traveling from one side of the membrane secured on the membrane support 206 to the other side of the membrane. A diffusion plate 210, which is generally a porous ceramic disk member is configured to generate a substantially laminar flow or even flow of fluid in the direction of the substrate being plated, is positioned in the cell between membrane 208 and the substrate being plated. The exemplary plating cell is further illustrated in commonly assigned U.S. patent application Ser. No. 10/268, 284, which was filed on Oct. 9, 2002 under the title "Electrochemical Processing Cell", claiming priority to U.S. Provisional Application Ser. No. 60/398,345, which was filed on Jul. 24, 2002, both of which are incorporated herein by reference in their entireties.

Figure 3:
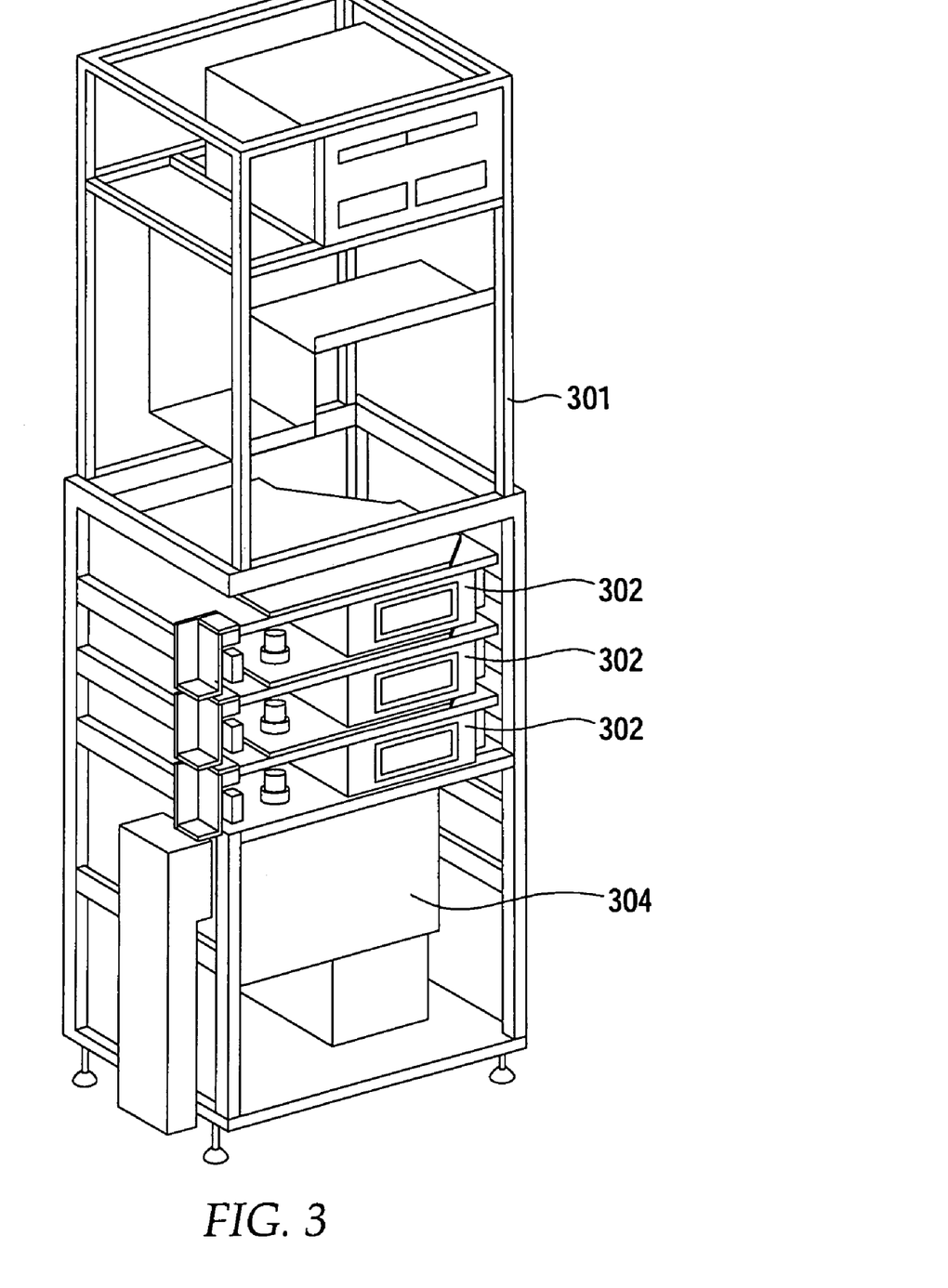
FIG. 3 illustrates a perspective view of an exemplary annealing system of the invention.

FIG. 3 illustrates a perspective view of an exemplary stacked annealing system 300 of the invention. The stacked annealing system 300 may be positioned at the annealing station 135 described in FIG. 1, or at another location on a processing platform, as desired. Annealing system 300 generally includes a frame 301 configured to support the various components of the annealing system 300. At least one annealing chamber 302 is positioned on the frame member 301 at a height that facilitates access thereto by a robot in the processing system, i.e., mainframe robot 120 or factory interface robot 132. In the illustrated embodiment, the annealing system 300 includes three (3) annealing chambers 302 stacked vertically on top of one another. However, embodiments of the invention are not intended to be limited to any particular number of annealing chambers or any particular spacing or orientation of the chambers relative to each other, as various spacing, numbers, and orientations may be implemented without departing from the scope of the invention. The annealing system 300 includes an electrical system controller 306 positioned on an upper portion of the frame member 301. The electrical system controller 306 generally operates to control the electrical power provided to the respective components of the annealing system 300, and in particular, the electrical system controller 306 operates to control the electrical power delivered to a heating element of the annealing chamber 302 so that the temperature of the annealing chamber may be controlled. Annealing system further includes fluid and gas supply assembly 304 positioned on the frame member 301, generally below the annealing chambers 302. The fluid and gas supply assembly 304 is generally configured to supply an annealing processing gas, such as nitrogen, argon, helium, hydrogen, or other inert gases that are amenable to semiconductor processing annealing, to the respective annealing chambers 302. Fluid and gas supply assembly 304 is also configured to supply and regulate fluids delivered to the annealing chamber 302, such as a cooling fluid used to cool the chamber body 302 and/or annealed substrates after the heating portion of the annealing process is completed. The cooling fluid, for example, may be a chilled or cooled water supply. Supply assembly 304 may further include a vacuum system (not shown) that is individually in communication with the respective annealing chambers 302. The vacuum system may operate to remove ambient gases from the annealing chambers 302 prior to beginning the annealing process and may be used to support a reduced pressure annealing process. Therefore, the vacuum system allows for reduced pressure annealing processes to be conducted in the respective annealing chambers 302, and further, varying reduced pressures may be simultaneously used in the respective annealing chambers 302 without interfering with the adjoining chamber 302 in the stack.

Figure 4:
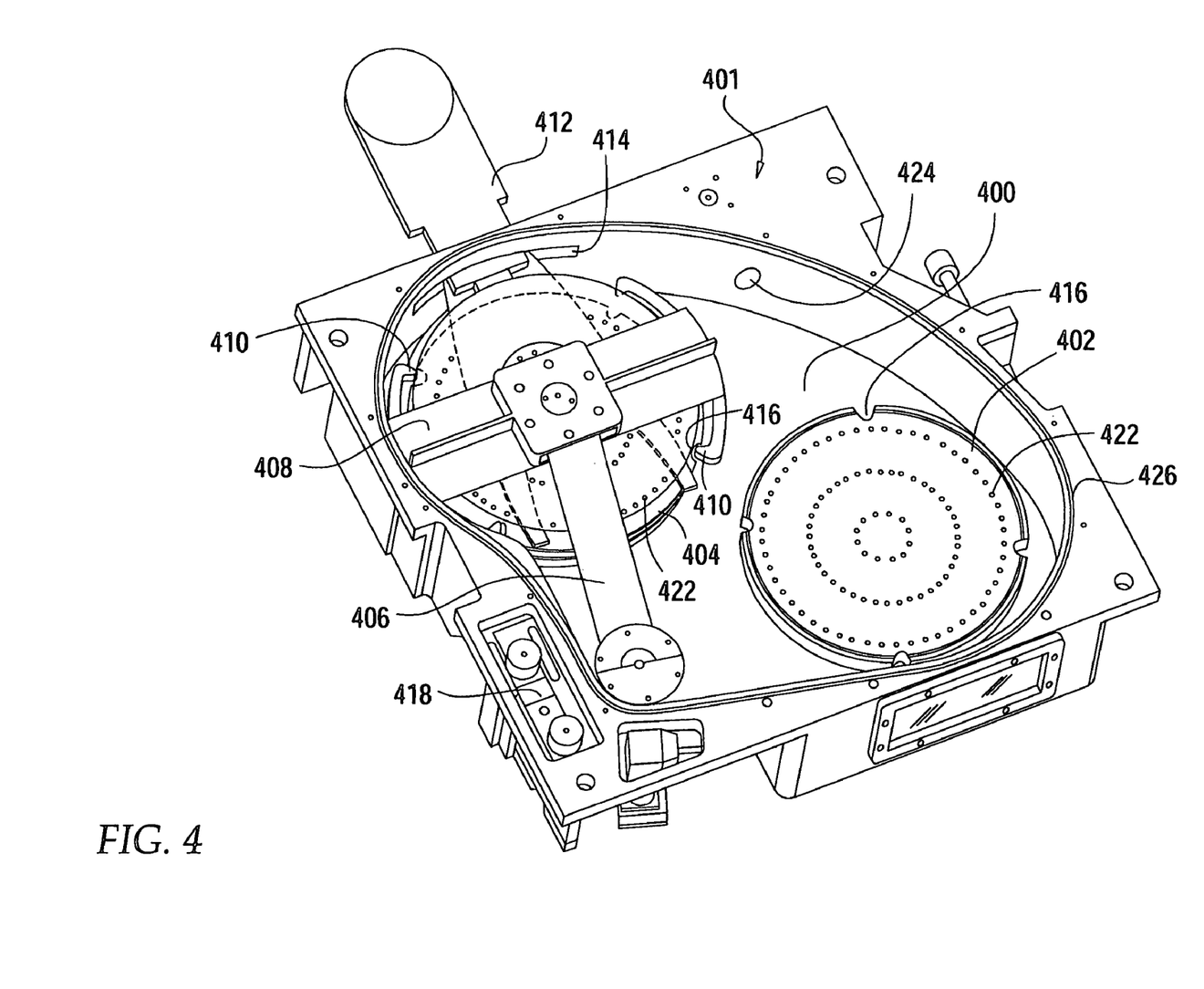
FIG. 4 illustrates a top perspective view of an exemplary annealing chamber of the invention.

FIG. 4 illustrates a top perspective view of an exemplary annealing chamber 302 of the invention with the cover or lid portion of the chamber removed so that the internal components are visible. The annealing chamber 302 generally includes a chamber body 401 that defines an enclosed processing volume 400. The enclosed processing volume 400 includes a heating plate 402 and a cooling plate 404 positioned therein proximate each other. A substrate transfer mechanism 406 is positioned adjacent the heating and cooling plates and is configured to receive a substrate from outside the processing volume 400 and transfer the substrate between the respective heating and cooling plates during an annealing process. The substrate transfer mechanism 406 generally includes pivotally mounted robot assembly having a substrate support member/blade 408 positioned at a distal end of a pivotal arm of the robot. The blade 408 includes a plurality of substrate support tabs 410 that are spaced from the blade 408 and configured to cooperatively support a substrate thereon. Each of the support tabs 410 are generally spaced vertically (generally downward) from a main body portion 408 of the blade, which generates a vertical space between blade 408 and tabs 410. This spacing allows for a substrate to be positioned on the tabs 410 during a substrate loading process, which will be further described herein. Further, each of the heating and cooling plates 402, 404 include a corresponding number of notches 416 formed into the outer perimeter thereof, wherein the notches 416 are spaced and configured to cooperatively receive tabs 410 therein when the blade member 408 is lowered toward to the respective heating and cooling plates 402, 404.

Figure 5:
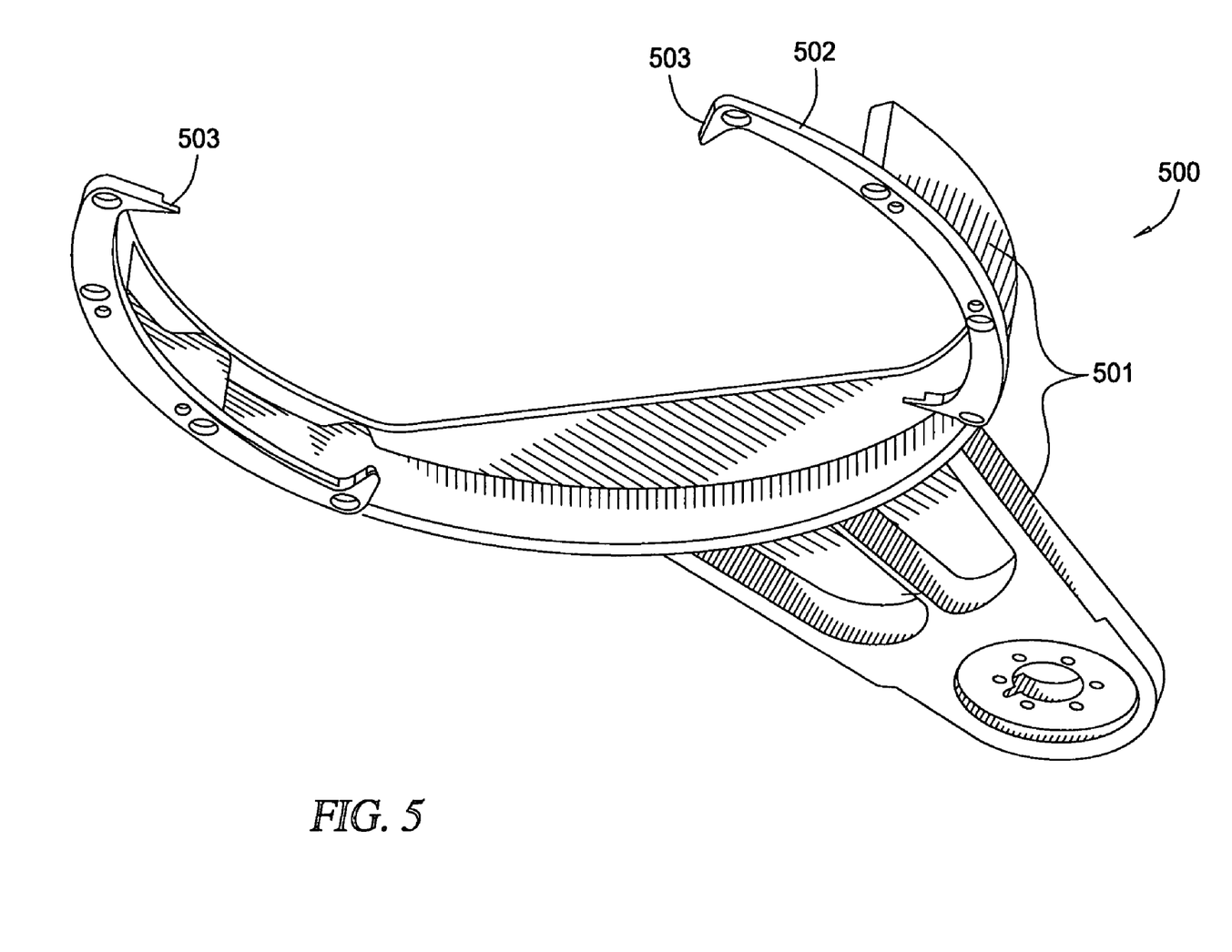
FIG. 5 illustrates a bottom perspective view of an exemplary robot blade of the invention.

In another embodiment of the invention, the transfer mechanism 406 includes a reinforced blade member 500, as illustrated in FIG. 5. The blade member 500 includes a unitary frame member 501 that is configured to maintain it's structural shape, i.e., the unitary blade member 501 is shaped and designed for minimal movement in the structure itself (wiggle, bending, bowing, etc.). The unitary frame member 501 includes a substrate supporting ring or member 502 attached to a lower portion of the frame member 501. The substrate support member 502 includes substrate support tabs 503 (similar to the tabs 410 illustrated in FIG. 4) that are positioned radially inward with respect to the frame member 501. The tabs, in similar fashion to tabs 410, are spaced and configured to support a substrate thereon, as well as be received in the notches 416 of the respective heating and cooling plates.

The body 401 of the annealing chamber, which may be manufactured from aluminum, for example, generally defines an interior processing volume 400. Outer body 401 generally includes a plurality of fluid conduits (not shown) formed therethrough, wherein the fluid conduits are configured to circulate a cooling fluid to reduce the temperature of the outer body 401. The cooling fluid may be supplied to the fluid conduits formed into the outer body 401 and circulated through the outer body 401 by cooling fluid connections 420.

The cooling plate 404 generally includes a substantially planar upper surface configured to support a substrate thereon. The upper surface includes a plurality of vacuum apertures 422, which are selectively in fluid communication with a vacuum source (not shown). The vacuum apertures 422 may generally be used to generate a reduced pressure at the upper surface of the cooling plate 404 in order to secure or vacuum chuck a substrate to the upper surface. The interior portion of the cooling plate may include a plurality of fluid conduits formed therein, wherein the fluid conduits are in fluid communication with the cooling fluid source used to cool the chamber body 401. When the fluid conduits are implemented into the cooling plate, the cooling plate may be used to rapidly cool a substrate positioned thereon. Alternatively, the cooling plate may be manufactured without the cooling passages formed therein, and in this embodiment, the cooling plate may be used to cool a substrate at a slower rate than the embodiment where the cooling plate is essentially chilled by the cooling conduits formed therein. Further, as noted above, the cooling plate 404 includes a plurality of notches 416 formed into the perimeter of the plate 404, wherein the notches 416 are spaced to receive the tabs 410 of the substrate support blade 408 when the blade is lowered into a processing position.

The heating plate 402, in similar fashion to the cooling plate 404, also includes a substantially planar upper substrate support surface. The substrate support surface includes a plurality a vacuum apertures 422 formed therein, each of the vacuum apertures 422 being selectively in fluid communication with a vacuum source (not shown). As such, the vacuum apertures 422 may be used to vacuum chuck or secure a substrate to the heating plate 402 for processing. The interior of the heating plate 402 includes a heating element (not shown), wherein the heating element is configured to heat the surface of the heating plate 402 to a temperature of between about 100° C. to about 500° C. The heating element may include, for example, an electrically driven resistive element or a hot fluid conduit formed into the heating plate 402, wherein the hot fluid is also configured to heat the surface of the heating plate 402. Alternatively, the annealing chambers of the invention may utilize an external heating device, such as lamps, inductive heaters, or resistive elements, positioned above or below the heating plate 402. Further, as noted above, the heating plate 402 includes a plurality of notches 416 formed into the perimeter of the plate 402, wherein the notches 416 are spaced to receive the tabs 410 of the substrate support blade 408 when the blade is lowered into a processing position. Additionally, one or more of the vacuum apertures 422 may also be in fluid communication with a heated gas supply, and as such, one or more of the apertures may be used to dispense a heated gas onto the backside of the substrate during processing. The heated gas, which may be heated to a temperature of between about 100° C. and 400° C., may be supplied from a plurality of apertures in fluid communication with the heated gas source, and then pumped from the backside of the substrate by other ones of the apertures 422 that are in fluid communication with the vacuum source noted above.

Figure 6:
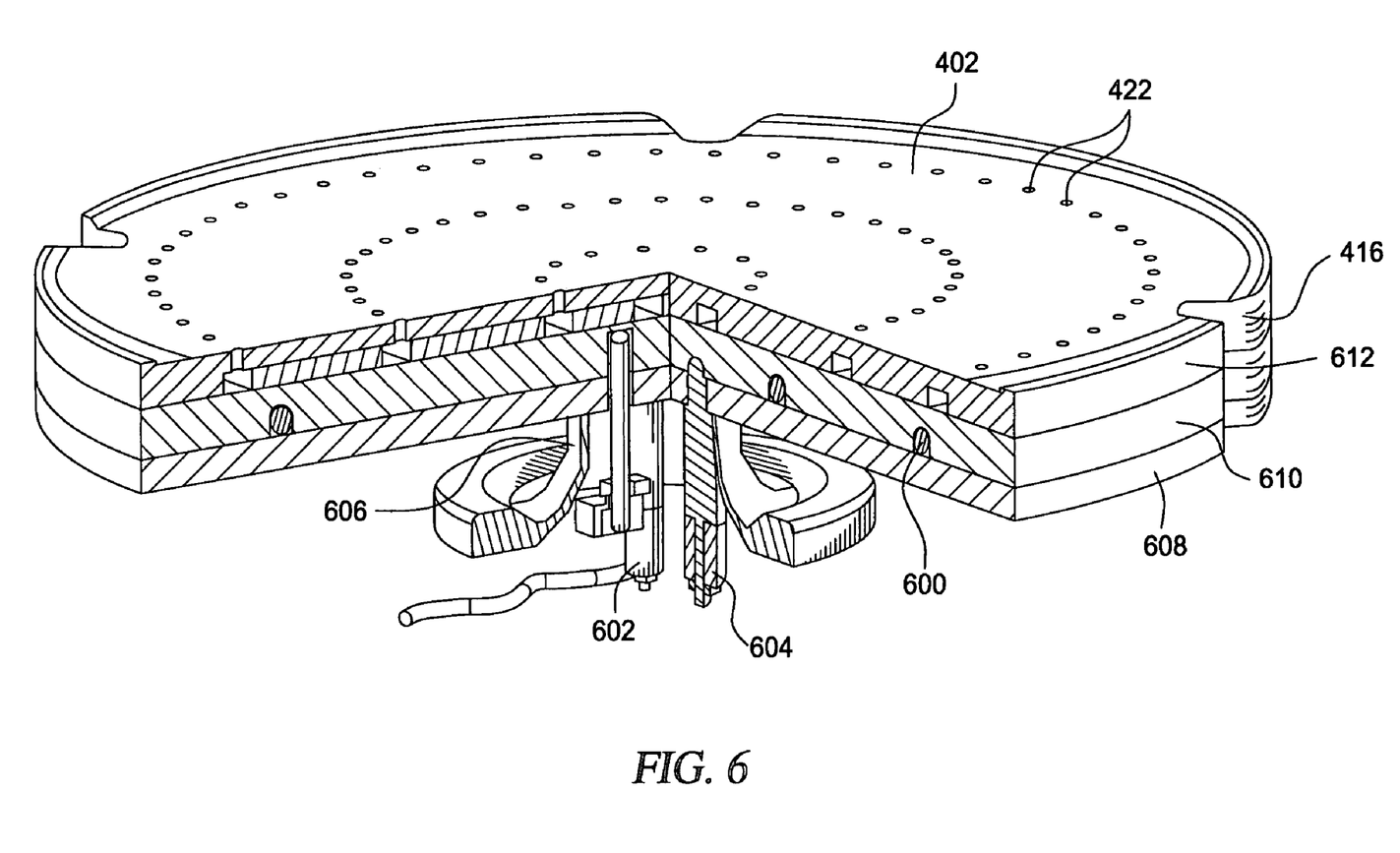
FIG. 6 illustrates a perspective view with a partial sectional view of the heating plate of the annealing chamber.
Figure 7:
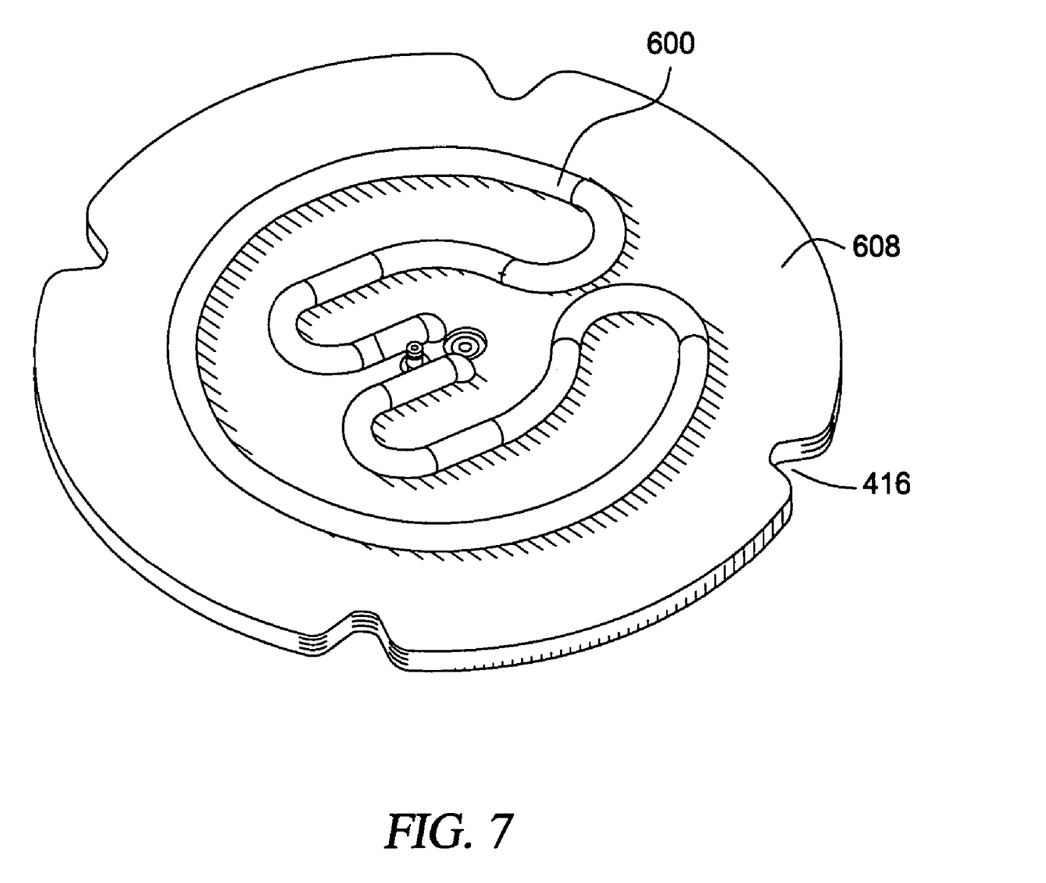
FIG. 7 illustrates a perspective view of a lower portion of the heating plate.

FIG. 6 illustrates a perspective view with a partial sectional view of the heating plate 402. The sectional view of plate 402 illustrates a heating plate base member 608 that has a resistive heating element 600 positioned thereon. The resistive heating element is encased in the interior portion 610 of the heating plate 402, as illustrated in FIG. 7. More particularly, the interior portion 601 includes a channel formed therethrough, wherein the channel is sized and spaced to receive the heating element 600. A top plate 612 is positioned above the interior portion 610. The top, interior, and base members 608 are generally manufactured from a metal having desirable thermal conductivity properties, such as aluminum, for example. Additionally, the three sections of the plate 402 may be brazed together to form a unitary heat transferring plate 402. The lower portion of the plate 402, i.e., the bottom of the base member 608, includes a stem 606 that supports the plate 402. The stem is generally of a substantially smaller diameter than the plate member 402, which minimizes thermal transfer to the chamber base or walls. More particularly, the stem member generally has a diameter of less than about 20% of the diameter of the heating plate 402. Additionally, the lower portion of the stem 606 includes a thermocouple 604 for measuring the temperature of the heating plate 402 and a power connection 602 to conduct electrical power to the heating element 600.

The annealing chamber may include a pump down aperture 424 positioned in fluid communication with the processing volume 400. The pump down aperture 424 is selectively in fluid communication with a vacuum source (not shown) and is generally configured to evacuate gases from the processing volume 400. Additionally, the annealing chamber generally includes at least one gas dispensing port 426 or gas dispensing showerhead positioned proximate the heating plate 402. The gas dispensing port is selectively in fluid communication with a processing gas source, i.e., supply source 304, and is therefore configured to dispense a processing gas into the processing volume 400. The gas dispensing port 426 may also be a gas showerhead assembly positioned in the interior of the annealing chamber, for example. The vacuum pump down aperture 424 and the gas dispensing nozzle may be utilized cooperatively or separately to minimize ambient gas content in the annealing chamber, i.e., both of the components or one or the other of the components may be used.

The annealing chamber 302 includes a substrate transfer mechanism actuator assembly 418 that is in communication with the robot 406. The actuator 418 is generally configured to control both pivotal movement of the blade 408, as well as the height or Z position of the blade relative to the heating or cooling member. An access door 414, which may be a slit valve-type door, for example, is generally positioned in an outer wall of the body portion 401. The access door 414 is generally configured to open and allow access into the processing volume 400 of the annealing chamber 302. As such, access door 412 may be opened and a robot 412 (which may be robot 132 from the exemplary FI or the exemplary mainframe substrate transfer robot 120 illustrated in FIG. 1, for example) may enter into the processing volume 400 to drop off or retrieve a substrate from one of the annealing chambers 302.

More particularly, the process of inserting a substrate into the annealing chamber includes, for example, positioning the blade 408 over the cooling plate 404 in a loading position, i.e., a position where the tabs 410 are vertically positioned at a location above the upper surface of the cooling plate 404. As briefly noted above, the blade 408 and tabs 410 are positioned relative to each other such that there is a vertical space between the upper surface of the tabs 410 and the lower surface of the blade 408. This vertical space is configured to allow a robot blade 412 having a substrate supported thereon to be inserted into the vertical space and then lowered such that the substrate is transferred from the blade 412 to the substrate support tabs 410. Once the substrate is supported by the tabs 410, the external robot blade 412 may be retracted from the processing volume 400 and the access door 414 may be closed to isolate the processing volume 400 from the ambient atmosphere. In this embodiment, once the door 414 is closed, a vacuum source in communication with the pump down aperture 424 may be activated and caused to pump a portion of the gases from the processing volume 400. During the pumping process, or shortly thereafter, the process gas nozzle(s) 426 may be opened to allow the processing gas to flood the processing volume 400. The process gas is generally an inert gas that is known not to react under the annealing processing conditions. This configuration, i.e., the pump down and inert gas flooding process, is generally configured to remove as much of the oxygen from the annealing chamber/processing volume as possible, as the oxygen is known to cause oxidation to the substrate surface during the annealing process. The vacuum source may be terminated and the gas flow stopped when the chamber reaches a predetermined pressure and gas concentration, or alternatively, the vacuum source may remain activated during the annealing process and the gas delivery nozzle may continue to flow the processing gas into the processing volume.

In another embodiment of the invention, a vacuum source is not used to purge the processing volume of unwanted gases, i.e., oxygen containing gases. Rather, a positive processing gas pressure is used to minimize the oxygen content in the processing volume 400. More particularly, the gas supply 426 to the processing volume 400 may be activated anytime when the door 414 is opened, so that a positive pressure is built up in the processing volume. This positive pressure causes an outward flow of gas from the annealing chamber when the door 414 is opened, which minimizes the amount of oxygen entering the processing volume 400. This process may be combined with a vacuum pump down process to increase the likelihood of removing the oxygen from the processing volume.

Once the substrate is positioned on the blade member 408, the substrate may be lowered onto the cooling plate 404 or heating plate 402. The process of lowering the substrate onto either the heating plate 402 or the cooling plate 404 generally includes positioning the blade member 408 above the respective plate such that the substrate support tabs 410 are positioned above the notches 416 formed into the perimeter of the plates. The blade member 408 may then be lowered such that the tabs 401 are received in the notches 416. As the substrate support tabs 410 are received in the notches 416, the substrate supported on the tabs 410 is transferred to the upper surface of the respective heating or cooling plate.

The transfer process generally includes activating the vacuum apertures 422 formed into the plate upper surfaces, so that a substrate is secured to the surface without movement when placed thereon. The heating plate is generally heated to a predetermined annealing temperature, such as between about 150° C. and about 400° C. or 450° C., before the substrate is positioned thereon. Alternative temperature ranges for the heating plate include between about 150° C. and about 250° C., between about 150° C. and about 325° C., and between about 200° C. and about 350° C., for example. The substrate is positioned on the heating plate 402 (generally vacuum chucked thereto) for a predetermined period of time and annealed, generally between about 15 seconds and about 120 seconds, for example, depending on the desired annealing temperature and the time required to generate the desired structure in the layer deposited on the substrate.

In high temperature annealing processes, i.e., annealing processes where the annealing temperature (the temperature of the heating plate 402) is high enough to thermally shock and possibly damage the substrate, a temperature ramping process may be implemented. In one embodiment the heating plate 402 may be maintained at a first temperature and the substrate may be positioned on the heating plate 402. The first temperature is calculated to begin the annealing process without damaging or shocking the substrate. Once the substrate is positioned on the heating plate, the temperature of the plate may be increased to a second temperature, wherein the second temperature is greater than the first temperature. In this configuration, the substrate temperature increases from the first temperature to the second temperature at a rate that is calculated not to damage or shock the substrate.

In another embodiment of the invention where a high temperature annealing process is used, the heating plate 402 is heated to the annealing temperature. However, the annealing process begins with the substrate being positioned immediately above the heating plate 402, e.g., an air space or gap is left between the substrate and the upper surface of the heating plate 402. During the time period while the substrate is positioned above the heating plate, i.e., hovered above the plate, heat is transferred from the plate 402 to the substrate, thus heating the substrate. Once the substrate temperature is increased to a temperature where thermal damage or shock may be prevented, then the substrate is lowered onto the heating plate 402, i.e., into direct contact with the heating plate. This configuration allows for temperature ramping of the substrate without having to control the heating mechanism of the heating plate 402.

Once the heating portion of the annealing process is completed, the substrate is transferred to the cooling plate 404. The transfer process includes terminating the vacuum chucking operation and lifting the blade member 408 upward until the tab members 410 engage and support the substrate thereon, i.e., wherein the tabs 410 lift the substrate off of the heating plate surface. The blade member 408 may then be pivoted from the heating plate 402 to the cooling plate 404. Once above the cooling plate 404, blade 407 may be lowered to position the substrate onto the cooling plate 404. In similar fashion to the lowering process described below, the substrate may be lowered onto the cooling plate while the vacuum apertures 422 are simultaneously operating to secure the substrate to the upper surface of the cooling plate 404.

The cooling plate may generally be maintained at a reduced temperature, such as between about 15° C. and about 40° C., and therefore, the cooling plate operates to receive or sink heat from the substrate positioned thereon or proximate thereto. This process may be used to cool the substrate from the annealing temperature down to less than about 70° C., or more particularly, between about 50° C. and about 100° C. in less than 1 minute, or more particularly, in less than about 15 seconds. More particularly, the cooling plate may be used to rapidly cool the substrate to between about 50° C. and about 70° C. in less than about 12 seconds. Once the substrate is cooled to the desired temperature, the blade 408 may be used to raise the substrate off of the cooling plate 404. With the substrate raised, the door 414 may be opened and the outside robot blade 412 may be brought into the processing volume and used to remove the substrate from the blade member 408. Once the substrate is removed, another substrate may be positioned in the annealing chamber and the annealing process described above repeated.

In another embodiment of the invention, the substrate temperature may be gradually ramped up to the annealing temperature or down to the cooled substrate temperature. More particularly, robot arm 406 may be lowered to a position just above the heating plate 402, i.e., spaced apart from the plate 402 by an air gap or space. The air gap between the substrate and the heating plate 402 functions as a thermal buffer to slow the temperature increase of the substrate. For example, heating plate 402 may be heated to about 210° C. and then the substrate may be positioned about 1 mm to about 5 mm away from the heating plate 402. The heat from the plate 402 slowly transfers to the substrate (slowly relative to the rate of heat transfer if the substrate were positioned directly onto the heating plate 402) across the air gap or space between the substrate and the heating plate 402. The ramp time to the annealing temperature may further be adjusted by adjusting the spacing of the substrate, i.e., if a faster ramp time is desired, then the substrate may be positioned closer to the heating plate. Similarly, positioning the substrate farther away from the heating plate, i.e., increasing the air gap, may be used to decrease the ramp time. The time to ramp may be between about 10 seconds and about 45 seconds, for example. Once the substrate temperature ramps up to the annealing temperature, then the substrate may be lowered onto the heating plate 402 for the remainder of the annealing process. Similarly, the robot may be positioned spaced from the cooling plate in order to ramp the cooling temperature down, if desired.

While the foregoing is directed to embodiments of the present invention, other and further embodiments of the invention may be devised without departing from the basic scope thereof, and the scope thereof is determined by the claims that follow.

What is claimed is:

1. An annealing system for a semiconductor processing platform, comprising a plurality of isolated annealing chambers, each of the isolated annealing chambers comprising:
   a heating plate positioned in an enclosed processing volume and configured to support a substrate thereon in a substantially face up orientation;
   a cooling plate positioned in the enclosed processing volume and configured to support a substrate thereon in a substantially face up orientation; and
   a substrate transfer mechanism positioned in the processing volume and configured to transfer substrates between the heating plate and the cooling plate.

2. The annealing system of claim 1, wherein the heating plate comprises a substantially planar upper substrate receiving surface having at least one vacuum chucking aperture formed therein.

3. The annealing chamber of claim 2, wherein the heating plate comprises at least one of a resistive heating element and an inductive heating element positioned in an interior portion of the heating plate below the substrate receiving surface.

4. The annealing system of claim 1, wherein the cooling plate comprises a substrate support member having at least one of a liquid cooling channel formed into an interior portion thereof and a thermoelectric cooling device positioned in an interior portion thereof.

5. The annealing system of claim 1, wherein the cooling plate comprises at least one vacuum aperture formed into an upper surface thereof.

6. The annealing system of claim 1, wherein the substrate transfer mechanism comprises a pivotally actuated robot arm having a distal substrate supporting blade positioned thereon.

7. The annealing system of claim 6, wherein the substrate support blade further comprises a plurality of inwardly facing substrate support tabs positioned below a main upper body portion of the support blade, the support tabs being positioned to support the substrate via contact with a backside of the substrate.

8. The annealing system of claim 7, wherein the heating plate and the cooling plate have a plurality of notches formed into a perimeter thereof, the plurality of notches being configured to receive the plurality of inwardly facing substrate support tabs when the robot blade is lowered toward the heating and cooling plates.

9. The annealing chamber of claim 1, wherein the plurality of isolated annealing chambers further comprise at least 3 stacked annealing chambers, each of the at least three stacked annealing chambers being fluidly separated from each other.

10. The annealing chamber of claim 1, further comprising a gas source in fluid communication with an interior volume of each of the annealing chambers, the gas source being configured to supply an inert gas to the processing volumes to maintain the oxygen content below about 100 ppm.

11. An annealing station for a semiconductor processing system, comprising:
a plurality of individual annealing chambers, each annealing chamber defining an isolated processing volume;
a heating plate positioned in the processing volume;
a cooling plate positioned in the processing volume; and
a substrate transfer robot positioned to receive a substrate from an externally positioned robot in a face up orientation and position the substrate onto the heating plate and the cooling plate in the face up orientation.

12. The annealing station of claim 11, wherein the individual processing volumes are fluidly isolated from each other.

13. The annealing station of claim 11, wherein the substrate transfer robot comprises:
a pivotally and vertically actuatable arm member; and
a blade member attached to a distal end of the arm member, the blade member having a plurality of inwardly extending substrate support tabs positioned thereon that are configured to engage a backside of a substrate.

14. The annealing station of claim 13, wherein the heating plate and the cooling plate have a plurality of vertically oriented channels formed into a perimeter of the plates, wherein the vertically oriented channels are configured to receive the inwardly extending substrate support tabs with the blade is lowered to the plane of the plates.

15. The annealing station of claim 11, wherein at least one of the heating plate and the cooling plate has a vacuum aperture formed into an upper substrate supporting surface, the vacuum aperture being configured to chuck a backside of the substrate to the respective plate.

16. The annealing station of claim 11, wherein a fluid channel is formed into an outer body portion of each of the plurality of individual annealing chambers, the fluid channel being in fluid communication with a cooling fluid source.

17. The annealing station of claim 11, wherein the heating plate is configured to heat a non-production surface of the substrate positioned thereon.

18. The annealing station of claim 11, further comprising a resistive heating element positioned in an interior portion of the heating plate.

19. The annealing station of claim 11, further comprising a sealable access door positioned in an outer body portion of the chamber.

20. The annealing station of claim 11, further comprising a vacuum source individually in communication with each of the processing volumes, the vacuum source being configured to generate a reduced pressure in each of the processing volumes.

21. The annealing station of claim 11, further comprising a processing gas supply selectively in communication with each of the annealing chambers.

22. A semiconductor processing platform, comprising:
a substrate loading station;
at least one substrate plating cell positioned in communication with the loading station;
at least one substrate cleaning cell positioned in communication with the loading station; and
an annealing station positioned in communication with the loading station, the annealing station comprising a plurality of annealing chambers, each of the annealing chambers comprising:
an enclosure forming a sealed processing volume;
a heating plate positioned in the sealed processing volume of each of the annealing chambers;
a cooling plate positioned in the sealed processing volume of each of the annealing chambers; and
a substrate transfer mechanism positioned to transfer substrates between the heating plate and the cooling plate.

23. The semiconductor processing platform of claim 22, further comprising at least one gas supply source selectively in communication with each of the sealed processing volumes, and adapted to supply a processing gas to each of the sealed processing volumes.

24. The semiconductor processing platform of claim 22, further comprising at least one vacuum source individually in communication with each of the sealed processing volumes, the vacuum source being configured to generate a reduced pressure individually in each of the processing volumes.

25. The semiconductor processing platform of claim 22, wherein the plurality of the annealing chambers are positioned in vertically stacked configuration.

* * * * *